United States Patent
Fiala et al.

(10) Patent No.: US 6,639,196 B1
(45) Date of Patent: Oct. 28, 2003

(54) METHOD AND APPARATUS FOR COOLING A CVI/CVD FURNACE

(75) Inventors: Robert Fiala, Spokane, WA (US); James W. Rudolph, Colorado Springs, CO (US); Dennis T. Garn, Pueblo, CO (US); Jerry S. Lee, Charlotte, NC (US)

(73) Assignee: Goodrich Corporation, Charlotte, NC (US)

( * ) Notice: Subject to any disclaimer, the term of this patent is extended or adjusted under 35 U.S.C. 154(b) by 235 days.

(21) Appl. No.: 09/586,419

(22) Filed: Jun. 2, 2000

Related U.S. Application Data

(60) Provisional application No. 60/137,590, filed on Jun. 4, 1999.

(51) Int. Cl.$^7$ .................................... H05B 6/10
(52) U.S. Cl. ................. 219/632; 118/724; 219/494
(58) Field of Search ................. 219/632, 618, 219/638, 623, 624, 626–627, 634–635, 650–651, 494, 420–421; 204/298.16, 192.12, 298.21; 432/72, 77, 78, 81, 4, 233; 118/724; 373/6, 7, 156–158

(56) References Cited

U.S. PATENT DOCUMENTS

| | | |
|---|---|---|
| 1,933,461 A | 10/1933 | Toll |
| 3,470,624 A * | 10/1969 | Plotkowiak .................. 34/428 |
| 3,850,417 A | 11/1974 | Elorza ......................... 266/5 |
| 3,884,793 A | 5/1975 | Penfold et al. |
| 3,995,187 A | 11/1976 | Penfold et al. |
| 4,030,996 A | 6/1977 | Penfold et al. |
| 4,031,424 A | 6/1977 | Penfold et al. |
| 4,422,407 A | 12/1983 | Bessot et al. |
| 4,490,108 A | 12/1984 | Petzi .......................... 432/23 |
| 4,573,431 A | 3/1986 | Sarkozy |
| 4,582,301 A * | 4/1986 | Wunning .................... 266/87 |
| 4,606,650 A | 8/1986 | Harris |
| 4,794,220 A | 12/1988 | Sekiya |
| 4,802,441 A | 2/1989 | Waugh ....................... 118/666 |
| 4,846,675 A | 7/1989 | Soliman ...................... 432/77 |
| 4,854,266 A | 8/1989 | Simson et al. |
| 4,979,896 A | 12/1990 | Kinoshita .................. 432/238 |

(List continued on next page.)

FOREIGN PATENT DOCUMENTS

| | | |
|---|---|---|
| EP | 0 410 442 A1 | 1/1991 |
| EP | 0 832 863 A3 | 1/1998 |
| EP | 0 846 787 A1 | 6/1998 |
| EP | 0 995 960 A2 | 4/2000 |

OTHER PUBLICATIONS

W.V. Kotlensky, *Deposition of Pyrolytic Carbon in Porous Solids*, 8 Chemistry and Physics of Carbon, 173, 190–203 (1973).

W.J. Lackey, *Review, Status, and Future of the Chemical Vapor Infiltration Proces for Fabrication of Fiber–Reinforced Ceramic Composites*, Ceram. Eng. Sci. Proc. 10[7–8] 577–81 (1989).

J. Linke et al., *Behavior of Boron Doped Graphites, Plasma Sprayed B4C, and a —C/B:H as Plasma Facing Material*, Fus. Tech. 20, 228–231, (9/91).

Ponnekanti et al., *Failure mechanisms of anodized aluminum parts used in CVD chambers*, J. Vac. Sci. Tech. A14(3), (5/96).

Primary Examiner—Quang T. Van
(74) Attorney, Agent, or Firm—Brinks Hofer Gilson & Lione

(57) ABSTRACT

A method and apparatus for cooling a furnace configured for processing refractory composites comprising a cooling gas flowed in a closed circuit through the furnace and over a cooling element disposed within the furnace. The cooling gas can flow either by natural convection or a convective force.

5 Claims, 6 Drawing Sheets

U.S. PATENT DOCUMENTS

| | | |
|---|---|---|
| 5,073,241 A | 12/1991 | Watanabe |
| 5,127,827 A * | 7/1992 | Hoetzl et al. .................. 432/72 |
| 5,377,297 A | 12/1994 | Nuutinen |
| 5,470,452 A | 11/1995 | Dickey et al. |
| 5,480,678 A | 1/1996 | Rudolph et al. |
| 5,589,421 A | 12/1996 | Miyashita et al. .......... 437/225 |
| 5,616,264 A * | 4/1997 | Nishi et al. .................. 219/494 |
| 5,625,170 A | 4/1997 | Poris |
| 5,702,531 A | 12/1997 | Mikata ........................ 118/697 |
| 5,725,746 A | 3/1998 | Dickey et al. |
| 5,748,666 A | 5/1998 | Andersson et al. ............ 373/9 |
| 5,853,485 A | 12/1998 | Rudolph et al. |
| 5,900,297 A | 5/1999 | Rudolph et al. |
| 5,910,006 A | 6/1999 | Conroy et al. |
| 6,162,298 A * | 12/2000 | Rudolph ..................... 118/715 |

\* cited by examiner

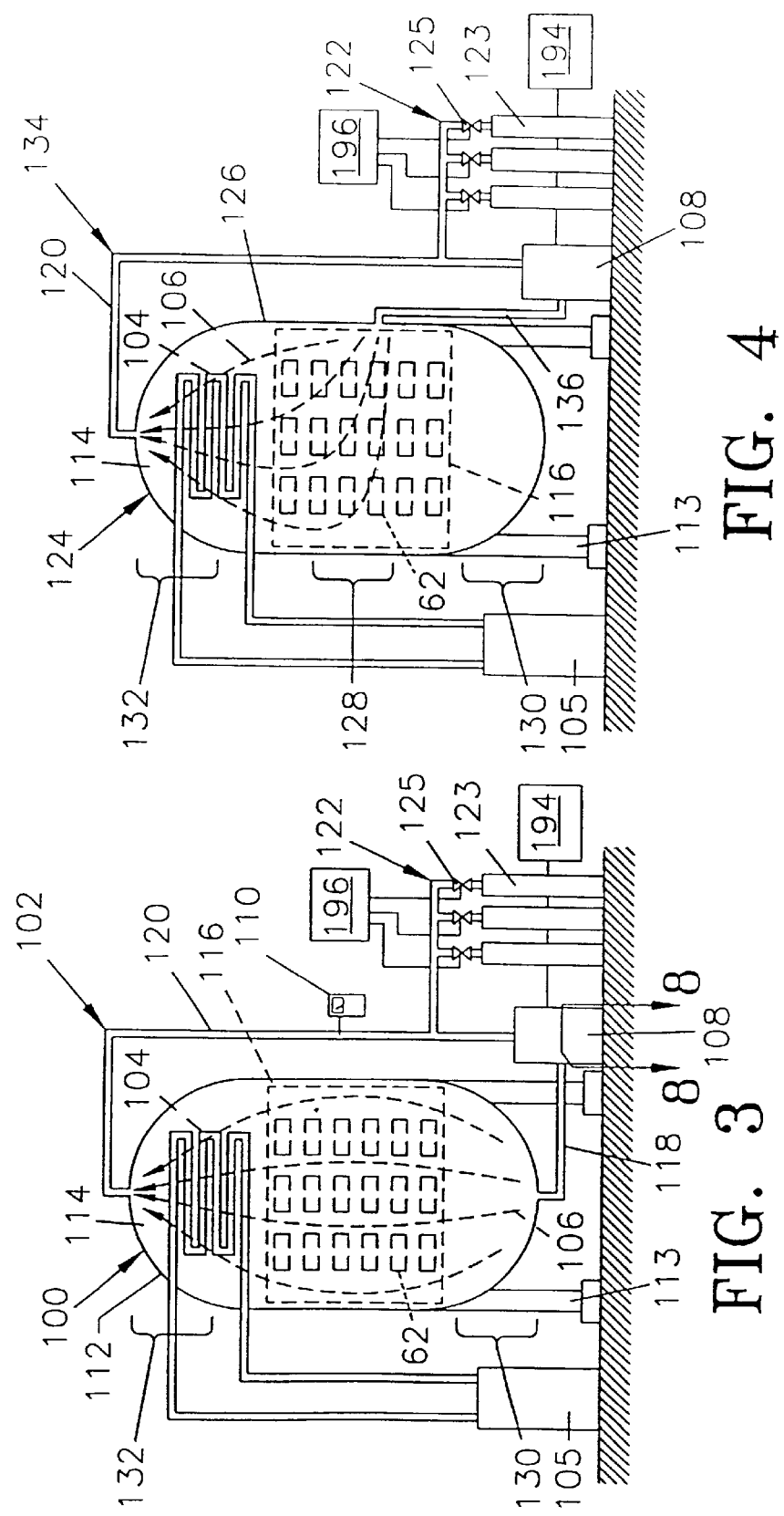

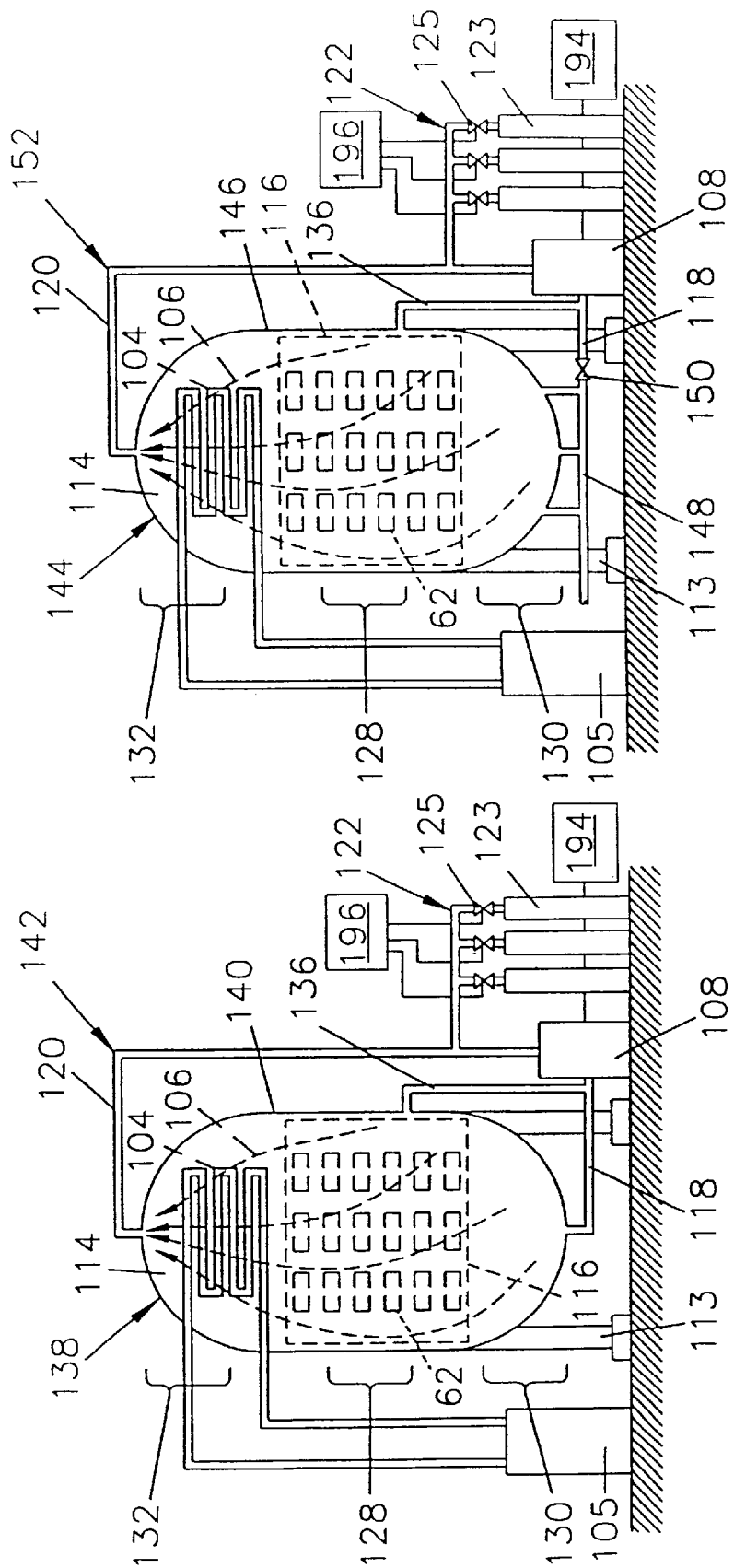

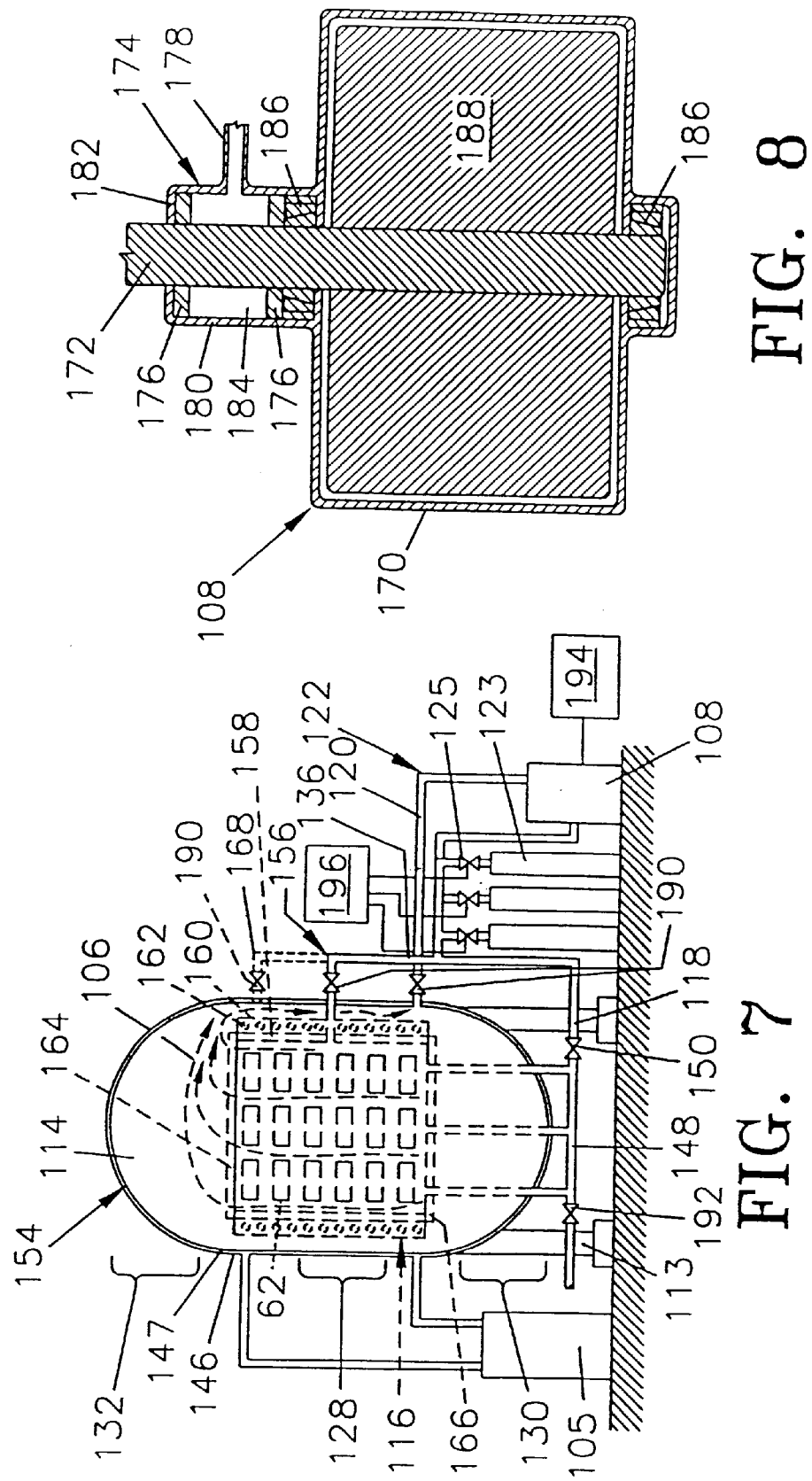

METHOD AND APPARATUS FOR COOLING A CVI/CVD FURNACE

RELATED APPLICATIONS

This non-provisional application claims the benefit of and incorporates by reference, in its entirety, U.S. provisional application serial No. 60/137,590, filed on Jun. 4, 1999. This application is related to U.S. Pat. No. 6,352,430 and application Ser. No. 09/780,170.

BACKGROUND OF THE INVENTION

The invention relates to method and an apparatus for cooling a furnace configured for processing refractory composites. More specifically, the invention is directed to method and apparatus for cooling a furnace more rapidly than known prior art methods.

Processing of refractory composites takes place at elevated temperatures. Such processing includes CVI/CVD deposition of a binding matrix within a fibrous preform structure, and heat treating refractory composites. According to conventional practice, the furnace is allowed to cool statically under vacuum or it is back-filled with an inert gas such as nitrogen. Cooling the furnace to a low enough temperature wherein the furnace may be opened can take days according to this method. In addition, cooling the furnace too rapidly or introducing a reactive gas, such as oxygen, can cause damage to the furnace itself or the refractory composites being processed in the furnace. Therefore, a method and apparatus is designed whereby the furnace and the refractory composites are cooled more rapidly and at a controlled pace than conventional known methods without causing damage to the composites.

BRIEF SUMMARY OF THE INVENTION

According to an aspect of the invention, a method is provided for cooling a furnace configured to process refractory composites, comprising the steps of: flowing a cooling gas in a closed circuit through the furnace, over the refractory composites disposed within the furnace, and over a cooling element disposed within the furnace. The method according to the invention may further comprise the step of flowing the cooling gas by natural convection. The method according to the invention may also further comprise the step of flowing the cooling gas by forced flow.

According to a further aspect of the invention, a furnace configured to process refractory composites and a cooling system therefor is provided, comprising: a furnace shell that defines a furnace volume; a heater disposed within the furnace shell; a cooling element disposed within the furnace shell; an inlet conduit connected to the furnace shell in fluid communication with the furnace volume; an outlet conduit connected to the furnace shell in fluid communication with the furnace volume; a cooling gas supply configured to selectively introduce a cooling gas into the furnace volume; and, a blower connected to the inlet conduit and the outlet conduit in fluid communication therewith, wherein activation of the blower causes cooling gas introduced into the furnace volume to flow through the blower, through the inlet conduit, over the cooling element, through the outlet conduit, and back to the blower in a closed circuit.

The invention includes various other aspects as presented by the detailed description that follows.

BRIEF DESCRIPTION OF SEVERAL VIEWS OF THE DRAWINGS

FIG. 3 presents a schematic view of a cooled furnace according to an aspect of the invention wherein the flow of cooling gas is forced.

FIG. 4 presents a schematic view of a cooled furnace according to an aspect of the invention wherein the flow of cooling gas is forced and wherein the inlet and outlet conduits are in an alternate position.

FIG. 5 presents a schematic view of a cooled furnace according to an aspect of the invention wherein the flow of cooling gas is forced and wherein the inlet and outlet conduits are in an alternate position.

FIG. 6 presents a schematic view of a cooled furnace according to an aspect of the invention wherein the flow of cooling gas is forced and wherein the reactive gas inlets are implemented to introduce a flow of cooling gas.

FIG. 7 presents an embodiment of the invention wherein cooling gas is introduced at multiple locations including the reactive gas inlets, and the cooling element is the furnace shell and the induction coil.

FIG. 8 presents a cross-sectional view of a blower with an inert gas purged dynamic shaft seal, according to an aspect of the invention.

DETAILED DESCRIPTION OF THE INVENTION

Various aspects of the invention are presented in FIGS. 1–10, which are not drawn to scale, and wherein like components, are numbered alike. Referring now to FIGS. 1–6, schematic representations of the basic concepts according to certain aspects of the invention are now presented. Literal interpretation of the configurations presented in FIGS. 1–6 is not intended since the actual configuration may vary greatly depending upon the particular implementation into a specific furnace design, all of which is within the skill of one of ordinary skill in the art. The apparatus and method for cooling a CVI/CVD furnace, as disclosed herein, may decrease the cooling time by about 25 to about 50%.

Figure 1:
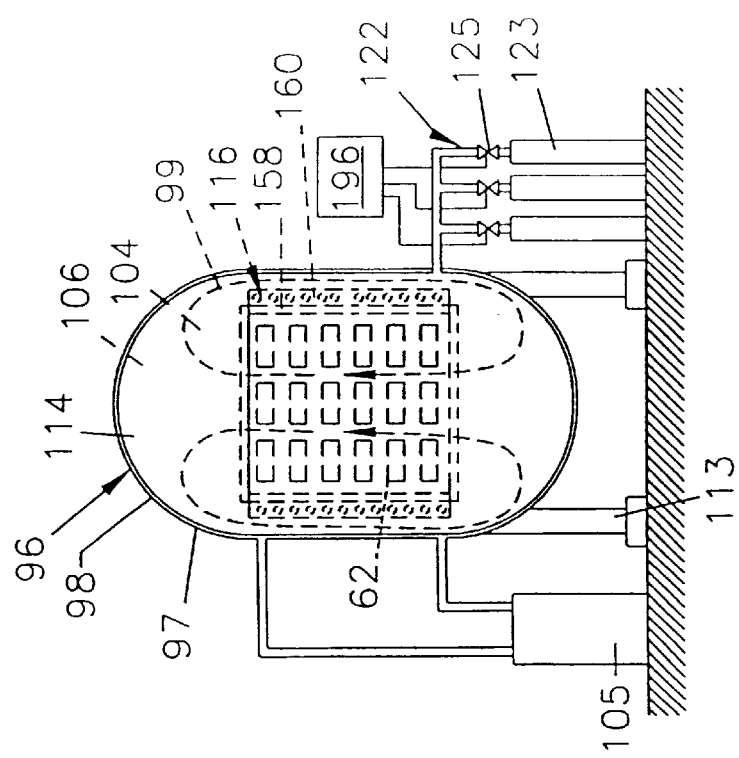
FIG. 1 presents a schematic view of a cooled furnace according to an aspect of the invention wherein the flow of cooling gas is induced by natural convection.

Specifically referring now to FIG. 1, the method and apparatus are presented for cooling a furnace 90 configured to process refractory composites, comprising the step of flowing a cooling gas 106 in a closed circuit through the furnace 90 and over a cooling element 104 disposed within the furnace 90, as indicated by the flow path 94. The gas also flows over refractory composites 62 disposed inside the furnace 100. As used herein, the term "refractory composites" includes fibrous refractory articles fully or partially permeated with a binding refractory matrix, and intermediate refractory articles (refractory fibrous preform structures, for example, such as carbon or ceramic fiber brake disk preforms). The term "refractory composites" also includes porous substrates or structures which can be subject to a CVI/CVD process. A cooling medium, such as water, is circulated through the cooling element 104 and a heat exchanger 105 external to the furnace 100.

The furnace 90 comprises a furnace shell 92 that defines a furnace volume 114, and is disposed upon legs 113. A heating element 116 is also disposed within the furnace 90 and heats the refractory composites 62 for CVI/CVD process and/or heat treatment processing. The heating element can be any heater. The gas flow is driven by natural convection. The refractory composites are quite hot at the beginning of the cooling process and heat the cooling gas to an elevated temperature which causes it to rise where it is cooled by the cooling element 104. The cooled gas falls due to the force of gravity and is directed toward the outer circumference of the furnace and back up through the bottom where it is once more heated. The cooling gas 106 is supplied to the furnace volume 114 by a cooling gas supply 122 that may be comprised of a single gas or a plurality of individual different gas supplies 123 with individual flow quantities controlled by flow control valves 125. Any inert gas or combination thereof can be used, provided that the gas or mixture of gases have a high capacity and are stable under the operating conditions. Examples of possible gases which can be used include, but are not limited to, nitrogen, helium or argon. Preferably, nitrogen is used.

Figure 2:
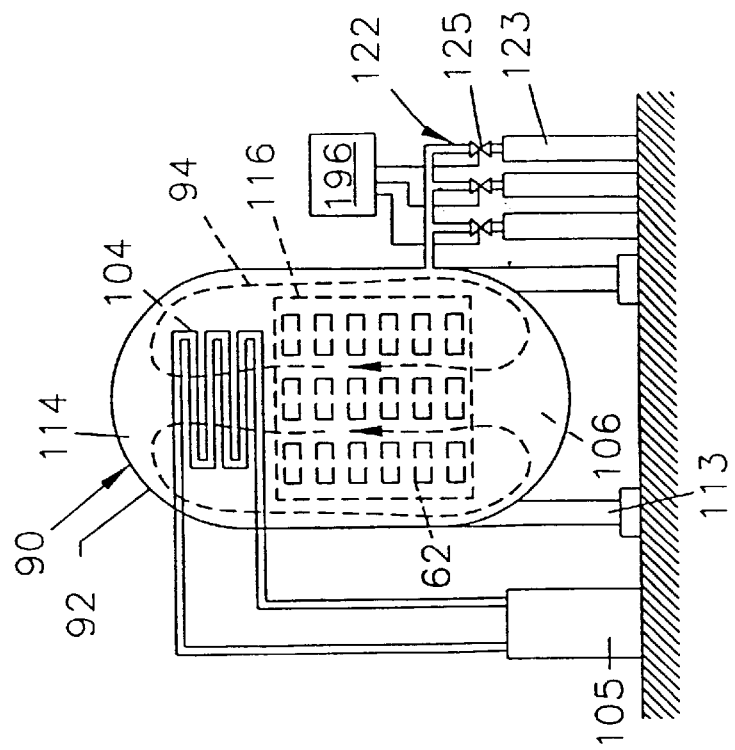
FIG. 2 presents a schematic view of a cooled furnace according to an aspect of the invention wherein the cooling element is the furnace shell and the induction coil.

Referring now to FIG. 2, a furnace 96 having a furnace shell 98 is presented according to similar arrangement wherein natural convection provides the motive force for the cooling gas 106, as indicated by the flow path 99. In furnace 96 the heating element 116 comprises a susceptor 158 and an induction coil 160 disposed adjacent the susceptor 158, and the cooling element is configured to cool the furnace shell 98, which, in this example, comprises a double wall with a space 97 in between filled with a cooling medium, such as cooling water that is circulated through the heat exchanger 105. The space 97 may be separated into multiple sub-spaces with independent cooling water flow circuits. In addition, induction coils typically comprise a multitude of coil cooling passages 162 integrally formed into the induction coil 160. Thus, the cooling element may further comprise the induction coil 160 with integral cooling passages 162 although, according to a preferred embodiment, the cooling is predominantly (if not totally) provided by the furnace shell 98.

In the embodiments of FIGS. 1 and 2, openings may be provided through the various components and fixtures within the furnace to allow the cooling gas to flow in the manner described, or external conduits may attached to the outside of the furnace to provide part of the flow path outside the furnace. These configurations, as well as other ones, are possible as long as the apparatus provides the CVI/CVD furnace with the desired cooling level.

Flow of the cooling gas 106 through the furnace may also be forced. Referring now to FIG. 3, a method is presented for cooling a furnace 100 configured to process refractory composites, according to a further aspect of the invention, comprising the step of flowing a cooling gas 106 in a closed circuit 102 through the furnace 100 and over a cooling element 104 disposed within the furnace 100. The gas also flows over refractory composites 62 disposed inside the furnace 100. A cooling medium, such as water, is circulated through the cooling element 104 and a heat exchanger 105 external to the furnace 100.

According to a further aspect of the invention, a method is provided for cooling the furnace 100, comprising the step of flowing the cooling gas 106 through the closed circuit 102 and over a cooling element disposed within the furnace, the closed circuit including the furnace 100, and a blower 108 disposed outside the furnace 100. The methods according to the invention may further comprise the step of monitoring the oxygen content of the cooling gas 106. An oxygen content analyzer 10 may be provided that senses the oxygen content of the cooling gas 106 in the closed circuit 102. The oxygen content is preferably maintained below a predetermined value so that oxidation does not occur in the furnace. For most processes, oxygen content should be less than or equal to 100 ppm to avoid oxidation and problems associated therewith.

The invention is particularly useful for cooling furnaces used in high temperature CVI/CVD and/or other heat treatment processes. As used herein, the term "high temperature" means a temperature substantially elevated above room temperature in the range of 300° C. or greater. Refractory composites or materials, generally, are manufactured and/or processed at temperatures greater than 300° C., and may be at least 900° C. and on the order of 900°–3000° C., or higher. For example, a porous carbon aircraft brake disk may have a pyrolytic carbon matrix deposited within it by a CVI/CVD process conducted at a temperature in the range of about 900°–1100° C., and may be further heat-treated at a temperature up to 2200° C. or higher. Manufacturing and processing of other types of ceramic materials may occur at other temperatures.

Still referring to FIG. 3, a furnace and cooling system are presented that may be implemented in practicing the invention. According to an aspect of the invention, the combination is provided comprising a furnace 100, a cooling gas inlet 118 in fluid communication with the furnace 100, a cooling gas outlet 120 in fluid communication with the CVI/CVD furnace 100, a cooling element 104 disposed within the furnace 100 in a location where it may be exposed to cooling gas 106, and a blower 108 outside the furnace 100 connected to the cooling gas inlet 118 and the cooling gas outlet 120 are provided. The blower 108 causes cooling gas to flow in a closed circuit 102 through the cooling gas inlet 118, through the furnace 100 over the cooling element 104, and through the cooling gas outlet 120 back to the blower 108. According to a further aspect of the invention, the furnace 100 comprises a furnace shell 112 that defines a furnace volume 114. The furnace shell may be disposed upon legs 113. A heating element 116 and the cooling element 104 are disposed within the furnace shell 112. The cooling gas inlet 118 may be formed as an inlet conduit connected to the furnace shell 112 in fluid communication with the furnace volume 114. The cooling gas outlet 120 may be formed as an outlet conduit also connected to the furnace shell 112 in fluid communication with the furnace volume 114. A cooling gas supply 122 configured to selectively introduce the cooling gas 106 into the furnace volume 114. The blower 108 is connected to the cooling gas inlet 118 and the outlet conduit 120 in fluid communication therewith. Activation of the blower causes cooling gas 106 introduced into the furnace volume 114 to flow through the blower 108, through the cooling gas inlet 118, over the cooling element 104, through the cooling gas outlet 120, and back to the blower 108 in a closed circuit.

Although the cooling element 104 is shown at the top of the furnace in FIGS. 1–4, this position may not be the optimum position due to the relatively high temperatures typically encountered in that region. As will become apparent, the cooling element 104 may be placed in a variety of positions within the furnace, and the inlet and outlet conduit positions changed accordingly to cause the cooling gas to flow over the cooling element 104. In addition, the inlets and outlets may be connected at multiple locations, as desired, to achieve a particular flow pattern.

The refractory composites 62 may comprise a multitude of porous substrates or structures stacked within the furnace 100 that are heated and exposed to a reactant gas that breaks down and deposits a matrix with the porous substrates 62. This process is commonly known as chemical vapor infiltration and deposition. Chemical vapor infiltration and deposition (CVI/CVD) is a well known process for depositing a binding matrix within a porous structure. The term "chemical vapor deposition" (CVD) generally implies deposition of a surface coating, but the term is also used to refer to infiltration and deposition of a matrix within a porous structure. As used herein, the term CVI/CVD is intended to refer to infiltration and deposition of a matrix within a porous structure. The technique is particularly suitable for fabricating high temperature structural composites by depositing a carbonaceous or ceramic matrix within a carbonaceous or ceramic porous structure resulting in very useful structures such as carbon/carbon aircraft brake disks, and ceramic combustor or turbine components.

The generally known CVI/CVD processes may be classified into four general categories: isothermal, thermal gradient, pressure gradient, and pulsed flow. See W. V. Kotlensky, Deposition of Pyrolytic Carbon in Porous Solids, 8 CHEMISTRY AND PHYSICS OF CARBON, 173, 190–203 (1973); W. J. Lackey, Review, Status, and Future of the Chemical Vapor Infiltration Process for Fabrication of Fiber-Reinforced Ceramic Composites, CERAM. ENG. SCI. PROC. 10[7–8] 577, 577–81 (1989) (W. J. Lackey refers to the pressure gradient process as "isothermal forced flow"). In an isothermal CVI/CVD process, a reactant gas passes around a heated porous structure at absolute pressures as low as a few torr. The gas diffuses into the porous structure driven by concentration gradients and cracks to deposit a binding matrix. This process is also known as "conventional" CVI/CVD. The porous structure is heated to a more or less uniform temperature, hence the term "isothermal." In a thermal gradient CVI/CVD process, a porous structure is heated in a manner that generates steep thermal gradients that induce deposition in a desired portion of the porous structure. The thermal gradients may be induced by heating only one surface of a porous structure, for example by placing a porous structure surface against a susceptor wall, and may be enhanced by cooling an opposing surface, for example by placing the opposing surface of the porous structure against a liquid cooled wall. Deposition of the binding matrix progresses from the hot surface to the cold surface. In a pressure gradient CVI/CVD process, the reactant gas is forced to flow through the porous structure by inducing a pressure gradient from one surface of the porous structure to an opposing surface of the porous structure. The flow rate of the reactant gas is greatly increased relative to the isothermal and thermal gradient processes which results in increased deposition rate of the binding matrix. This process is also known as "forced-flow" CVI/CVD. Finally, pulsed flow involves rapidly and cyclically filling and evacuating a chamber containing the heated porous structure with the reactant gas. The cyclical action forces the reactant gas to infiltrate the porous structure and also forces removal of the cracked reactant gas by-products from the porous structure. Refractory composites are often subjected to heat treatments at various temperatures, and the invention is equally useful in furnaces employed for that purpose. The furnace and fixture configuration may vary substantially depending upon the type of process, and the various aspects of the invention may be implemented with any of these processes, depending upon the particular configuration. As such, the furnace configurations of FIGS. 1–7 and 9–10 are presented by way of example, and are not intended to limit the invention to the specific arrangements presented as other variations or modifications that are evident to persons skilled in the art in light of the description provided herein.

According to a certain embodiment, the cooling gas 106 comprises a predetermined ratio of gases so long as the mixture of gases is stable at high temperatures and has the desired heat capacity. The cooling gas supply 122 may comprise a multitude of individual gas supplies 123 in fluid communication with the cooling gas inlet 118. Each individual gas supply 123 may provide a different gas composition, and flow control valves 125 may be provided to control flow of a particular gas composition into the cooling gas inlet 118. The flow control valves 125 may be used in combination to provide a flow of gas into the cooling gas inlet 118 comprising a predetermined ratio of gases by individually controlling the flow of each gas. The cooling gas supply 122 may be connected to the furnace 100 in other ways that introduce the flow of cooling gas into the furnace, for example, by connecting the cooling gas supply 122 directly to the furnace 100, or by connecting the cooling gas supply 122 to the cooling gas outlet 120. Other alternatives for particular applications are apparent to a person of ordinary skill in the art in light of the description provided herein. The individual gas supplies 123 may be bottles or cylinders of gas or a gas supply otherwise available at a manufacturing facility, such as for example but not limited to, a plant nitrogen supply. Other suitable gases for cooling include helium and argon, typically supplied by bottle or cylinder. Although, nitrogen is relatively inexpensive, it may react with materials inside the furnace at elevated temperatures. For example, nitrogen may react with carbon/graphite above 2500° F. to form cyanogen gas. Helium has a higher thermal conductivity than nitrogen or argon, but has a lower atomic weight than nitrogen or argon, so more is required. Argon is more stable than nitrogen at elevated temperatures, especially above 2500° F., has a much greater atomic weight than helium and has a greater heat capacity than helium or nitrogen. An ideal mixture takes advantage of all of these characteristics to provide the least expensive mixture which is stable and has optimum cooling characteristics at the temperatures encountered for a particular process. The optimum mixture may be different for different processes and depends upon the peak temperatures encountered in the furnace, as well as the possible reactivity of other components that are in the furnace.

Alternatively, a single cooling gas may be employed. Any inert gas can be used. If a single inert gas is used, nitrogen is preferred. If the cooling gas is reactive at a certain critical temperature, back-filling the furnace volume with the cooling gas may be delayed while the furnace cools under vacuum to a temperature less than the critical temperature according to prior practice in the art. The cooling gas is subsequently introduced into the furnace volume and circulated in the manner described. For example, if nitrogen is used as the cooling gas, the furnace may be allowed to cool under vacuum according to prior practice in the art until reactive components are at a temperature on the order of 2000° F. or less, after which the furnace volume is filled with the cooling gas to approximately atmospheric pressure and the cooling gas is then circulated. The furnace volume may be partially filled if the temperature is greater than the critical temperature, which may increase the cooling rate with minimal chemical reaction. The temperature at which certain cooling gases are introduced may be dependent upon the reactivity of certain components within the furnace. The presence of certain cooling gases and the overall composition of the cooling gas may be altered accordingly.

The composition of the cooling gas may be changed while it is being circulated in order to affect the rate at which the furnace is cooled. For example, the cooling rate typically decreases if the cooling conditions are not changed. Changing the cooling conditions may increase or decrease the rate as a function of time. According to a certain embodiment, the composition of the cooling gas is changed to produce a constant rate at which the furnace is cooled, which produces an approximately linear time versus temperature curve (negative constant slope). The flow rate of the cooling gas may also be altered to affect the rate at which the furnace is cooled, for example by increasing or decreasing the rate. According to a certain embodiment, the flow rate of the cooling gas is altered to produce a constant rate at which the furnace is cooled, which produces an approximately linear time versus temperature curve (negative constant slope). According to a preferred embodiment, both the gas composition and the cooling gas flow rate are changed during the cooling process to produce a constant rate at which the furnace is cooled and a linear time versus temperature curve.

In the embodiment presented in FIG. 3, the furnace shell has two end portions 130 and 132, and the cooling gas inlet 118 is connected to one of the end portion 130. The position of the cooling gas inlet 18 and cooling gas outlet 120 depends, in part, upon the desired flow pattern of cooling gas through the furnace volume 114. As such, innumerable variations are possible. Referring now to FIG. 2, for example, a CVI/CVD furnace and cooling system is presented wherein the position of the cooling gas inlet 118 is moved to produce a change in the flow of the cooling gas. The various components previously described in relation to FIG. 3 are presented in FIG. 4, except that the furnace 100 is replaced by a furnace 124, having a furnace shell 126 with a center portion 128 disposed between two end portions 130 and 132. According to this aspect of the invention, a closed circuit 134 having an inlet conduit 136 is connected to the furnace 100 at the center portion 128. Connecting the inlet conduit 136 to the furnace 100 at the center portion 128 provides a flow of the cooling gas to the area that is typically the hottest. According to a further aspect of the invention, there is a blower control 194 which controls the activation of the blower 108. According to this aspect time, temperature, and the cooling rate data are fed back into the blower control 194, and based on this, data, the blower control 194 adjusts the activation of the blower 108 to maintain a prescribed rate of cooling. The blower is turned on until the temperature is cooled to 400° F. or less. Generally, the time the blower is activated is dependent upon numerous factors, including the load in the furnace, and the process that had been run in the furnace.

Referring now to FIG. 5, a CVI/CVD or heat treatment furnace and cooling system is presented that combines the features of FIGS. 3 and 4. The various components previously described in relation to FIGS. 1 and 2 are presented in FIG. 5, except that furnace 138 having a furnace shell 140 is provided. The furnace shell 140 has a center portion 128 disposed between two end portions 130 and 132. According to this aspect of the invention, a closed circuit 142 having cooling gas inlet 118 and 136 is connected to the furnace 138 at the end portion 130 and the center portion 128, respectively. Connecting the inlet conduit 136 to the furnace 138 at the center portion 128 provides a flow of the cooling gas to an area of the furnace 138 that is typically the hottest, while connecting the cooling gas inlet 118 to the furnace 138 at the end portion 130 provides a flow of gas to refractory composites 62 disposed below the inlet conduit 136. Multiple inlet conduits 136 may be provided, if so desired. The cooling gas outlet 120 is connected to the other of the end portions 132. Overall cooling of the furnace may thereby be improved relative to the embodiments of FIGS. 3 and 4 with these two particular embodiments.

Other connections into a furnace may also be utilized as cooling gas inlets or cooling gas outlets. Referring now to FIG. 6, for example, a CVI/CVD or a heat treatment furnace and cooling system is presented according to a further aspect of the invention. The various components previously described in relation to FIG. 5 are presented in FIG. 6. A furnace 144 is provided having a furnace shell 146 with a center portion 128 disposed between two end portions 130 and 132. Furnace 144 comprises a reactant gas inlet 148 connected to the furnace shell 146 in fluid communication with the furnace volume 114. A closed circuit 152 is provided wherein the cooling gas inlet 118 is connected to the furnace shell 146 through the reactant gas inlet 148 and is configured to selectively introduce cooling gas into the furnace volume 114 through the reactant gas inlet 148. Thus, the cooling gas inlet 118 is in fluid communication with the furnace volume 114 through the reactant gas inlet 148. At times, reactant gas flow rather than cooling gas flow is desired through the reactant gas inlet 148. Thus, cooling gas is selectively introduced into the furnace volume 114 when such flow is desired. This is preferably accomplished by provision of a valve 150 provided in the cooling gas inlet 118 that isolates the reactant gas inlet 148 from the cooling gas inlet 118 when closed. The inlet conduit 136 may be provided and connected to the center portion 128.

Referring now to FIG. 7, a preferred embodiment of the invention comprising a furnace 154 and a closed circuit 156 is shown. In furnace 154 the heating element 116 comprises a susceptor 158 and an induction coil 160 disposed adjacent the susceptor 158, and the cooling element is configured to cool the furnace shell 146, which, in this example, comprises a double wall with a space 147 in between filled with cooling water that is circulated through the heat exchanger 105. The space 147 may be separated into multiple sub-spaces with independent cooling water flow circuits. In addition, induction coils typically comprise a multitude of coil cooling passages 162 integrally formed into the induction coil 160. Thus, the cooling element may further comprise the induction coil 160 with integral cooling passages 162 although, according to a preferred embodiment, the cooling is predominantly (if not totally) provided by the furnace shell 146.

The susceptor 158 typically comprises a susceptor lid 164 and a susceptor floor 166. The reactant gas inlet 148 passes through the susceptor floor 166. The cooling gas outlet 120 is disposed beneath the center portion 128, and the inlet conduit 136 is connected to the center portion 128 and passes through the induction coil 160 and susceptor 158. Cooling gas introduced into the cooling gas inlet 118 and inlet conduit 136 enters the volume encircled by the susceptor 158 where the refractory composites 62 are disposed. The cooling gas then passes up through the susceptor lid 164 (which is typically perforated) and over the inside surface of the furnace shell 146 and down between the furnace shell 146 and the induction coil 160, where it is cooled, and then passes into the cooling gas outlet 120 and back to the blower 108. Activation of the blower 108 causes cooling gas 106 introduced into the furnace volume 114 to flow through the blower 108, through the cooling gas inlet 118, over the cooling element (in this example, the furnace shell 146 and induction coil 160 with cooling passages 162), through the cooling gas outlet 120, and back to the blower 108 in a closed circuit. In this embodiment, the cooling element is embodied in two sub-elements and serves two purposes. It cools the furnace shell 146 and the induction coil 160 when the coil is heating the susceptor 158 and, alternatively, cools the cooling gas when the closed circuit 156 is operated to cool the furnace 154.

Although described in relation to the cooling element being the furnace shell 146 and/or the induction coil 160 with coil cooling passages 162, any arrangement disposed within the furnace for the purpose of cooling a component inside the furnace may be employed to cool the cooling gas, and such arrangements may take a variety of configurations whether employed to cool the furnace shell, an induction coil, or otherwise, any of which are intended to be included within the scope of the invention. Finally, the cooling gas inlet may comprise one or more auxiliary inlets, such as auxiliary inlet 168 (shown as a dashed line) connected to the furnace above the center portion 128 in order to provide a flow of cooler gas to the top of the induction coil 160 where hotter gas from inside the susceptor passes over the induction coil 160 in transit to the cooling gas outlet 120 disposed below the center portion. Other variations may be employed, as desired, to achieve a particular desired flow pattern and/or to eliminate hot and/or cold spots. Shut-off valves 190 are preferably provided in the auxiliary inlet 168, the inlet conduit 136, and the cooling gas outlet 120 that isolate the furnace 154 from the rest of the closed circuit during a CVI/CVD or heat treatment process. A shut-off valve 192 is preferably provided in the reactant gas inlet 148 that isolates the reactant gas supply from the closed circuit 156 while using the closed circuit cool the furnace 154.

Referring now to FIG. 8, a cross sectional view of an embodiment of the blower 108 is presented, according to a preferred aspect of the invention, taken along line 8—8 of FIG. 3. The blower 108 comprises a housing 170 and a drive shaft 172 extending therefrom, and an inert gas purged dynamic seal 174 between the housing 170 and the drive shaft 172. The housing 170 comprises a main housing 184. A pair of bearing assemblies 186 mounted to the main housing 184 support the drive shaft 172. An impeller 188 is attached to the drive shaft 172. The impeller 188 may be configured for axial flow, centrifugal flow, or a combination thereof, as a fan or otherwise. The inert gas purged dynamic seal 174 comprises a pair of seals 176 that may be spaced apart and disposed within a sealed seal housing 182 that is sealed to housing 170, and an inert gas inlet 178 that introduces inert gas 194 into the space between the seals 180 at a pressure greater than atmospheric pressure. The cooling gas 106 may be employed as the inert gas 194. Purging the space between the bearings with pressurized inert gas eliminates oxygen ingress into the cooling gas within the blower 108 and the closed circuit through which the blower 108 drives cooling gas. An inert gas purged dynamic seal 174 may not be necessary or desirable in all aspects of the invention. Other components, such as view ports, may be inert gas sealed with dynamic or static seals, depending on whether moving parts are employed. According to a preferred embodiment of the invention for processing high temperature composite materials, the entire closed circuit is sealed to prevent ingress of oxygen into the closed circuit. Carbon seals have been found to be particularly desired for seals 176 in such an embodiment. Inert gas purged seals may be employed to minimize or eliminate ingress of oxygen, when desired.

Figure 9:
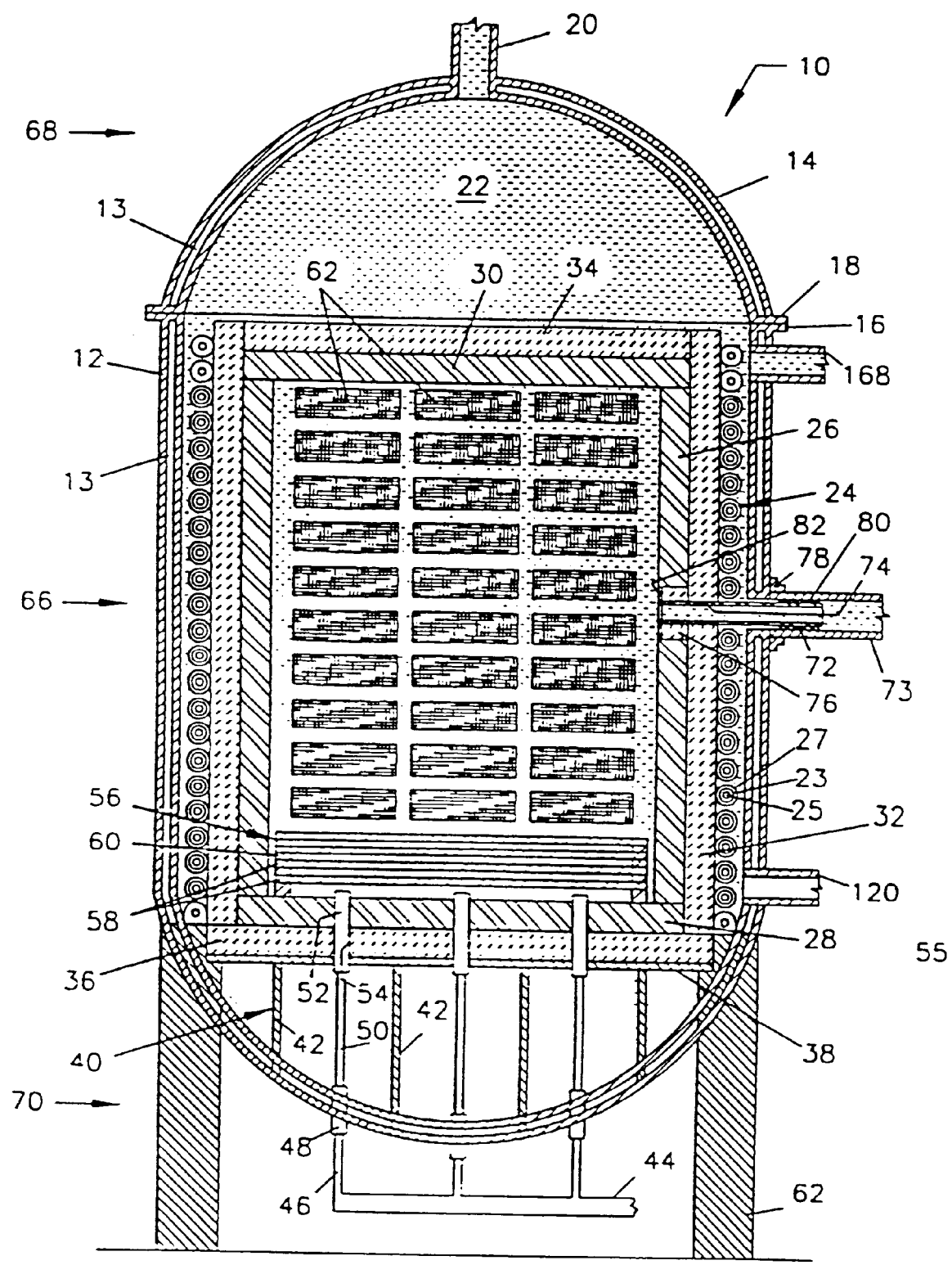
FIG. 9 presents a side cross-sectional view of a furnace according to a certain embodiment of the invention.

Referring now to FIG. 9, a cross-sectional view of a high temperature furnace 10 is presented, by way of example, that implements various aspects of the invention. Furnace 10 is configured to be employed with a high temperature process. Furnace 10 is generally cylindrical and comprises a steel shell 12 and a steel lid 14 both formed as double walls with a space 13 in between for circulation of cooling water, as previously described in relation to FIG. 5. Still referring to FIG. 9, the shell 12 comprises a flange 16 and the lid 14 comprises a mating flange 18 that seals against flange 16 when the lid 14 is installed upon the shell 12. The shell 12 and lid 14 together define a furnace volume 22 that is reduced to vacuum pressure by a steam vacuum generator (not shown) in fluid communication with the vacuum port 20. The shell 12 rests upon a multitude of legs 62 (FIG. 9.) The furnace 10 also comprises a cylindrical induction coil 24 adjacent a cylindrical susceptor 26. The induction coil 24 comprises coiled conductors 23 encapsulated by electrical insulation 27. During operation, the induction coil 24 develops an electromagnetic field that couples with the susceptor 26 and generates heat within the susceptor 26. The induction coil 24 may be cooled, typically by integral water passages 25 within the coil 24. The susceptor 26 rests upon a susceptor floor 28 and is covered by a susceptor lid 30. A cylindrical insulation wall 32 is disposed in between the susceptor 26 and the induction coil 24. Lid insulation layer 34 and floor insulation layer 36 are disposed over the susceptor lid 30 and beneath the susceptor floor 28, respectively. The susceptor floor 28 rests upon the insulation layer 36 which, in turn, rests upon a furnace floor 38. The furnace floor 38 is attached to the shell 12 by a floor support structure 40 that comprises a multitude of vertical web structures 42. A reactant gas is supplied to the furnace 10 by a main gas supply line 44. A multitude of individual gas supply lines 46 are connected in fluid communication with a multitude of gas ports 48 that pass through the furnace shell 12. A multitude of flexible gas supply lines 50 are connected in fluid communication with the gas ports 48 and a multitude of gas inlets 52 that pass through holes 54 in the furnace floor 38, the floor insulation layer 36, and the susceptor floor 28. A gas preheater 56 rests on the susceptor floor 28 and comprises a multitude of stacked perforated plates 58 that are spaced from one another by a spacing structure 60. Each plate 58 is provided with an array of perforations that are horizontally shifted from the array of perforations of the adjacent plate 58. This causes the reactant gas to pass back and forth through the plates, which diffuses the reactant gas within the preheater 56 and increases convective heat transfer to the gas from the perforated plates 58. A multitude of refractory composites 62, for example brake disks, are stacked within the furnace 10 inside the susceptor 26 on fixtures (not shown for clarity). Suitable fixtures are well known in the art.

Still referring to FIG. 9, the susceptor 26 is configured as a cylindrical wall 26 having a center portion 66 disposed between two end portions 68 and 70. An inlet conduit 72 enters the furnace 10. The center portion 66 has a hole 74 therein with the inlet conduit 72 entering the hole 74 and being configured to introduce cooling gas within the cylindrical wall 26 at the hole 74. An insulating bushing 76 may be disposed within the hole 74 mating with the cylindrical wall 26 and the inlet conduit 72. In passing through the hole 74, the inlet conduit 72 extends through the induction coil 24 and the insulation wall 32. The inlet conduit 72 is preferably made from an insulating material and mates with a steel conduit 73 that is welded to the furnace 78. A pliant gasket 80 is disposed between the inlet conduit 72 and the steel conduit 73, which permits the inlet conduit 72 to move relative to the steel conduit 73 as the furnace 10 heats up and cools down while maintaining a seal. If the insulating bushing 76 is made from a porous insulating material, a bushing seal layer 82 may be bonded to the surface that would otherwise be exposed to reactant gas. The inside diameter of the inlet conduit 72 is preferably covered with an impervious sheet if the inlet conduit 72 is made from a porous insulating material. According to a preferred embodiment for CVI/CVD depositing a pyrolytic carbon matrix within carbon fiber porous structures for aircraft brake disks, the furnace 154 of FIG. 7 is configured as furnace 100 of FIG. 9, preferably with the auxiliary inlet 168. According to a certain embodiment, the inlet conduit 72 is manufactured from porous carbon, such as Porous Carbon 60 material, available from UCAR Carbon Company Inc., United States of America. The insulating bushing 76 is a rigid felt, such as Calcarb CBCF material, available from Calcarb, Ltd., Scotland, or Fibergraph® material, available from SIGRI Polycarbon, Inc., United States of America. The bushing seal layer 82, pliant gasket 80, and impervious layer lining inside the inlet conduit 72 are a graphite foil, such as Grafoil® material, also available from UCAR Carbon Company Inc. Calgraph® brand graphite foil may also be employed, also available from SIGRI Polycarbon, Inc.

A method of cooling a furnace initially at CVI/CVD process temperatures (on the order of 1800° F.) proceeds as follows. Valve 192 is closed and the furnace volume 22 inside the furnace is back-filled from vacuum (about 10 torr) to atmospheric pressure by flowing on the order of 275 Standard Cubic Feet/Hour ("SCFH") nitrogen, 200 SCFH helium, and 75 SCFH argon. When the pressure of furnace volume 22 reaches on the order of atmospheric pressure, all gas flows are terminated and the valves 190 are opened. The oxygen content analyzer sensor 110 (FIG. 1) is activated along with the fan shaft seal purge. The blower 108 at a speed of 25 Hz (the blower is rated at 800 CFM at 60 Hz) is activated and the oxygen level of the cooling gas 106 is monitored and maintained at less than or equal to 100 ppm. Oxygen levels typically remain steady in the range of 40–100 ppm, and should reach that range after 15–30 minutes. If oxygen levels become too high, i.e., over 100 ppm, the entire system is shut off. Upon temperature inside the furnace decreasing to on the order of 1050° F. the fan speed is increased to 30 Hz and a flow of 30 SCFH helium is initiated and subsequently terminated after a period of approximately six hours (the vessel is pressure relieved to avoid positive pressure above atmospheric). Upon temperature reaching 750° F., the fan speed is increased to 35 Hz and a flow of 30 SCFH of helium is again initiated for another period of approximately six hours and thereafter terminated. When the temperature inside the furnace is decreased to a final temperature of 600° F. or less, the furnace lid may be removed and the cooling system deactivated. Alternatively, the cooling system may be left running in order to circulate atmospheric air through the furnace. Increasing fan speed and helium flow rate as the furnace cools increases the cooling rate and allows approximation of a linear cool-down (rather than asymptotic) from the initial temperature to the final temperature. This method is particularly useful for cooling carbon/carbon composite brake disks from CVI/CVD processing temperature. Alternatively, instead of helium, nitrogen can be used for the cool-down.

A method of cooling a furnace initially at a refractory composite heat treatment temperature (on the order of 3400° F.) proceeds similarly to the process just described with the following exceptions. The furnace is back-filled with a gas mixture that is ¾ argon and ¼ helium since these gases are stable at that initial temperature. Less helium is used at greater temperatures in order to prevent cooling at too fast of a rate, which may damage components inside the furnace, for example the induction coil and/or the refractory composite structures being heat treated. When the furnace temperature reaches on the order of 1850° F., a 30 SCFH flow of helium is initiated. Subsequently, additional helium and higher fan speeds are enacted as previously described.

Figure 10:
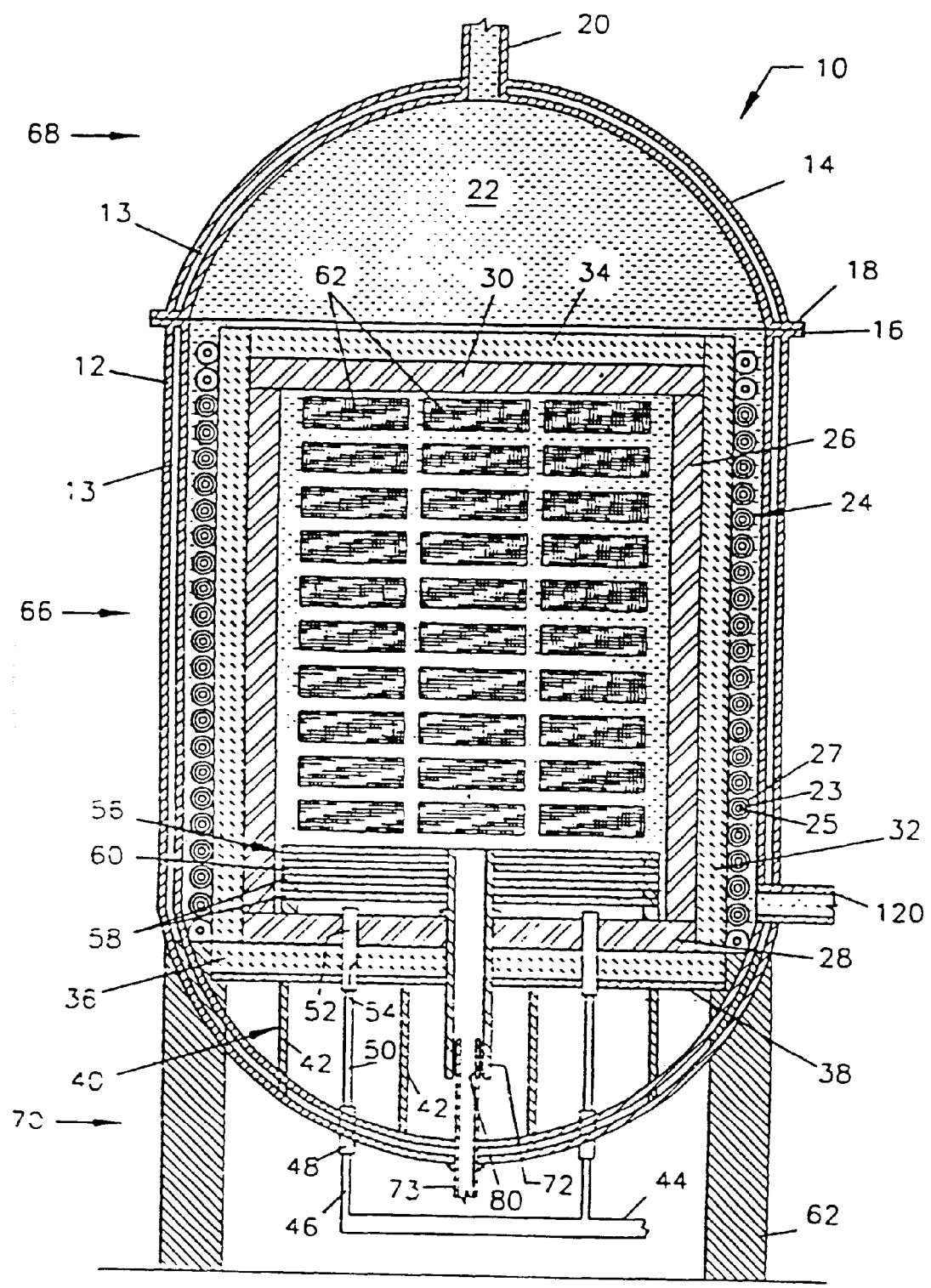
FIG. 10 presents a side cross-sectional view of a furnace according to a certain embodiment of the invention.

Referring now to FIG. 10, a furnace 10 according to a further aspect of the invention is presented that is similar to furnace 10 of FIG. 9 except the cooling gas inlet through the side of the furnace is replaced by a similar inlet that enters the furnace from the bottom and passes up through the center of the gas preheater 56. The inlet conduit 72 may be split into multiple inlets if desired. This furnace may be implemented according to the embodiment of FIG. 5.

Although the invention has been described and illustrated with reference to specific illustrative embodiments thereof, it is not intended that he invention be limited to those illustrative embodiments. Those skilled in the art will recognize that variations and modifications can be made without departing from the true scope and spirit of the invention as defined by the claims that follow. It is therefore intended to include within the invention all such variations and modifications as fall within the scope of the appended claims and equivalents thereof.

What is claimed is:

1. A furnace configured to process refractory composites and a cooling system, comprising:
   a furnace shell that defines a furnace volume, said furnace shell having a center portion;
   a reactant gas inlet connected to said furnace shell in fluid communication with said furnace volume;
   a susceptor disposed within said furnace shell;
   an induction coil disposed within said furnace shell adjacent said susceptor, said induction coil comprising a cooling element;
   an inlet conduit connected to said furnace shell at said center portion and through said reactant gas inlet, said inlet conduit being in fluid communication with said furnace volume;
   an outlet conduit connected to said furnace shell in fluid communication with said furnace volume;
   a cooling gas supply configured to selectively introduce a cooling gas into said furnace volume;
   a blower connected to said inlet conduit and said outlet conduit in fluid communication therewith, wherein activation of said blower causes cooling gas introduced into said furnace volume to flow through said blower, through said inlet conduit, over said cooling element, through said outlet conduit, and back to said blower in a closed circuit, and
   a blower control which controls the activation of said blower, wherein time, temperature, and cooling rate data are fed back into said blower control, and said blower control adjusts the activation of said blower to maintain a prescribed rate of cooling.

2. A furnace configured to process refractory composites and a cooling system therefore, comprising:
   a furnace shell that defines a furnace volume;
   a heater disposed within said furnace shell;
   a cooling element disposed within said furnace shell;
   an inlet conduit connected to said furnace shell in fluid communication with said furnace volume;
   an outlet conduit connected to said furnace shell in fluid communication with said furnace volume;
   a cooling gas supply configured to selectively introduce a cooling gas into said furnace volume;
   a blower connected to said inlet conduit and said outlet conduit in fluid communication therewith, wherein activation of said blower causes cooling gas introduced into said furnace volume to flow through said blower, through said inlet conduit, over said cooling element, through said outlet conduit, and back to said blower in a closed circuit, wherein said blower comprises a housing and a drive shaft extending therefrom, and an inert gas purged dynamic seal between said housing and said drive shaft, and a blower control which controls the activation of said blower, wherein time, temperature, and cooling rate data are fed back into said blower control, and said blower control adjusts the activation of said blower to maintain a prescribed rate of cooling.

3. A furnace configured to process refractory composites and a cooling system, comprising:

a furnace shell that defines a furnace volume, said furnace shell having a center portion;

a reactant gas inlet connected to said furnace shell in fluid communication with said furnace volume;

a susceptor disposed within said furnace shell;

an induction coil disposed within said furnace shell adjacent said susceptor, said induction coil comprising a cooling element;

an inlet conduit connected to said furnace shell at said center portion and through said reactant gas inlet, said inlet conduit being in fluid communication with said furnace volume;

an outlet conduit connected to said furnace shell in fluid communication with said furnace volume;

a cooling gas supply configured to selectively introduce a cooling gas into said furnace volume, a blower connected to said inlet conduit and said outlet conduit in fluid communication therewith, wherein activation of said blower causes cooling gas introduced into said furnace volume to flow through said blower, through said inlet conduit, over said cooling element, through said outlet conduit, and back to said blower in a closed circuit, wherein said blower comprises a housing and a drive shaft extending therefrom, and an inert gas purged dynamic seal between said housing and said drive shaft, and a blower control which controls the activation of said blower, wherein time, temperature, and cooling rate data are fed back into said blower control, and said blower control adjusts the activation of said blower to maintain a prescribed rate of cooling.

4. A furnace configured to process refractory composites and a cooling system therefore, comprising:

a furnace shell that defines a furnace volume;

a heater disposed within said furnace shell;

a cooling element disposed within said furnace shell;

an inlet conduit connected to said furnace shell in fluid communication with said furnace volume;

an outlet conduit connected to said furnace shell in fluid communication with said furnace volume;

a cooling gas supply configured to selectively introduce a cooling gas into said furnace volume;

a blower connected to said inlet conduit and said outlet conduit in fluid communication therewith, wherein activation of said blower causes cooling gas introduced into said furnace volume to flow through said blower, through said inlet conduit, over said cooling element, through said outlet conduit, and back to said blower in a closed circuit, and a blower control which controls the activation of said blower, wherein time, temperature, and cooling rate data are fed back into said blower control, and said blower control adjusts the activation of said blower to maintain a prescribed rate of cooling, wherein said furnace shell has a center portion, said inlet conduit being connected to said furnace at said center portion.

5. A furnace configured to process refractory composites and a cooling system therefore, comprising:

a furnace shell that defines a furnace volume;

a heater disposed within said furnace shell;

a cooling element disposed within said furnace shell;

an inlet conduit connected to said furnace shell in fluid communication with said furnace volume;

an outlet conduit connected to said furnace shell in fluid communication with said furnace volume;

a cooling gas supply configured to selectively introduce a cooling gas into said furnace volume;

a blower connected to said inlet conduit and said outlet conduit in fluid communication therewith, wherein activation of said blower causes cooling gas introduced into said furnace volume to flow through said blower, through said inlet conduit, over said cooling element, through said outlet conduit, and back to said blower in a closed circuit, and a blower control which controls the activation of said blower, wherein time, temperature, and cooling rate data are fed back into said blower control, and said blower control adjusts the activation of said blower to maintain a prescribed rate of cooling, wherein said furnace shell has a center portion disposed between two end portions, said inlet conduit being connected to said center portion and one of said end portions, said outlet conduit being connected to the other of said end portions.

* * * * *